US007495838B2

United States Patent
Krneta et al.

(10) Patent No.: US 7,495,838 B2
(45) Date of Patent: Feb. 24, 2009

(54) COLLIMATION LENS GROUP ADJUSTMENT FOR LASER SYSTEM

(75) Inventors: Vladimir Krneta, Longmont, CO (US); Kirk William Cook, Lyons, CO (US)

(73) Assignee: Inphase Technologies, Inc., Longmont, CO (US)

( * ) Notice: Subject to any disclaimer, the term of this patent is extended or adjusted under 35 U.S.C. 154(b) by 66 days.

(21) Appl. No.: 11/826,517

(22) Filed: Jul. 16, 2007

(65) Prior Publication Data
US 2008/0019011 A1   Jan. 24, 2008

Related U.S. Application Data

(60) Provisional application No. 60/831,692, filed on Jul. 19, 2006.

(51) Int. Cl.
*G02B 27/30* (2006.01)
*G02B 7/02* (2006.01)
*H01S 3/08* (2006.01)

(52) U.S. Cl. .................. 359/641; 359/813; 372/101

(58) Field of Classification Search ............ 33/290, 33/292, 296; 359/641, 793, 808, 811, 813, 359/819, 822, 823, 827, 829; 372/50.23, 372/98, 101, 107
See application file for complete search history.

(56) References Cited

U.S. PATENT DOCUMENTS

| 5,050,179 | A | * | 9/1991 | Mooradian | ............... 372/44.01 |
| 5,058,124 | A | | 10/1991 | Cameron et al. | |
| 5,400,133 | A | * | 3/1995 | Hinton et al. | ............... 356/138 |
| 5,521,764 | A | * | 5/1996 | Balogh et al. | ............... 359/824 |

(Continued)

OTHER PUBLICATIONS

PCT/US2007/06094 International Search Report and the Written Opinion of the International Searching Authority, or the Declaration, mailed Aug. 22, 2008.

(Continued)

*Primary Examiner*—David N Spector
(74) *Attorney, Agent, or Firm*—Jagtiani + Guttag

(57) ABSTRACT

A laser system comprising a laser assembly for generating a light beam, and collimation assembly movable axially with respect to the laser assembly and being positioned in the optical path of the light beam. The collimation assembly comprises a collimation lens group comprising a first lens component positioned within a first lens mounting cell, a second lens component positioned within a second lens mounting cell and provided with a central portion for receiving and cooperating with the first cell to thereby adjust the axial spacing between the first and second lens components, means for radially adjusting the position of the second cell with respect to the first cell to thereby radially adjust the optical axis of the second lens component with respect to the optical axis of the first lens component, and means formed in the central and flange portions of the second cell for creating flexure therein.

59 Claims, 9 Drawing Sheets

U.S. PATENT DOCUMENTS

| | | | |
|---|---|---|---|
| 6,047,008 | A | 4/2000 | Funakawa |
| 6,292,311 | B1* | 9/2001 | Bohn et al. ................. 359/819 |
| 6,317,278 | B1* | 11/2001 | Metsala ..................... 359/813 |
| 6,414,763 | B1 | 7/2002 | Hesselink et al. |
| 6,449,627 | B1 | 9/2002 | Baer et al. |
| 6,525,888 | B2* | 2/2003 | Schletterer ................. 359/822 |
| 6,614,566 | B1 | 9/2003 | Curtis et al. |
| 6,661,589 | B2* | 12/2003 | Takanashi et al. ........... 359/819 |
| 6,891,879 | B2* | 5/2005 | Peterson et al. ............ 372/107 |
| 6,972,910 | B2* | 12/2005 | Orimo et al. ................ 359/694 |
| 7,040,030 | B2 | 5/2006 | Sawaguchi |
| 7,092,133 | B2 | 8/2006 | Anderson et al. |

OTHER PUBLICATIONS

PCT/US2006/19906 International Search Report and the Written Opinion of the International Searching Authority, or the Declaration, mailed Sep. 16, 2008.

* cited by examiner

COLLIMATION LENS GROUP ADJUSTMENT FOR LASER SYSTEM

CROSS-REFERENCE TO RELATED APPLICATIONS

This application makes reference to U.S. Provisional Patent Application No. 60/831,692, entitled "External Cavity Diode Laser Collimation Group Adjustment" filed Jul. 19, 2006. The entire disclosure and contents of the above application is hereby incorporated by reference.

BACKGROUND

1. Field of the Invention

The present invention relates generally to collimation adjustment of a light beam generated by a laser system, as well as a collimation lens group and flexure cell used in laser systems for such collimation adjustment.

2. Related Art

External cavity diode laser systems may require that the light beam generated by the laser diode be collimated. The light beam generated by the laser diode may be collimated using one or more optical components. Depending on the optical design requirements of the laser system, adjustment of the collimation lenses may be very demanding (e.g., providing required degrees of freedom for adjustment). Further, these adjustments are often be made with a very fine resolution on the order of about 1 micrometer resolution. For example, in many laser systems, centering these lenses and adjusting the axial spacing between the lenses may be highly sensitive and very small alignment errors may result in significant degradation of the quality of the generated laser beam. Additionally, in many laser systems the lenses may be very small (e.g., approximately 6 mm in height) further complicating the task of aligning the lenses. As such, there is a need for improved systems for adjusting the alignment of the lenses in a collimation group for laser systems.

SUMMARY

According to a first broad aspect of the present invention, there is provided a device comprising a collimation lens group comprising:
   a first lens component having an optical axis;
   a second lens component having an optical axis and being axially spaced from the first lens component;
   a first lens component mounting cell having a lens mounting space within which the first lens component is positioned;
   a second lens component mounting cell having a flange portion and a central portion extending from the flange portion, the central portion comprising:
      a lens component mounting section within which the second lens component is positioned and radially movable; and
      a cell coupling section;
   means for adjustably coupling the first cell to the cell coupling section to adjust the axial spacing between the first and second lens components;
   means formed in the flange portion for creating axial adjustment flexure in the flange portion;
   means formed in the lens mounting section for creating radial adjustment flexure in the lens mounting section; and
   means for radially adjusting force imparted to the lens mounting section to cause the second lens component to move radially with respect to the first lens component to thereby radially adjust the second lens component optical axis with respect to the first lens component optical axis.

According to a second broad aspect of the present invention, there is provided a system comprising a laser system comprising:
   a laser assembly for generating a laser light beam having an optical path; and
   a collimation assembly axially spaced from and axially movable with respect to the laser assembly and being positioned in the optical path, the collimation assembly comprising:
      a first lens component having an optical axis;
      a second lens component having an optical axis and being axially spaced from the first lens component;
      a first lens component mounting cell having a lens component mounting space within which the first lens component is positioned;
      a second lens component mounting cell having a flange portion and a central portion extending from the flange portion, the central portion comprising:
         a lens component mounting section within which the second lens component is positioned and radially movable; and
         a cell coupling section;
      means for adjustably coupling the first cell to the cell coupling section to adjust the axial spacing between the first and second lens components;
      means formed in the flange portion for creating axial adjustment flexure therein the flange portion;
      means formed in the lens mounting section for creating radial adjustment flexure in the central portion;
      means for radially adjusting force imparted to the lens mounting section to cause the second lens component to move radially with respect to the first lens component to thereby radially adjust the second lens component optical axis with respect to the first lens component optical axis; and
      means for adjusting the axial spacing between the collimation assembly and the laser assembly to thereby focus the light beam.

According to a third broad aspect of the present invention, there is provided an article comprising a flexure cell comprising:
   a generally annular shaped flange portion;
   means formed in the flange portion for creating axial adjustment flexure in the flange portion;
   a generally cylindrical central portion extending generally perpendicularly from the flange portion, the central portion comprising:
      a lens component mounting section within which a first lens component having an optical axis may be positioned and radially moved; and
      a cell coupling section having a threaded surface for mating with a threaded surface of a second lens component mounting cell having a lens component mounting space within which a second lens component having an optical axis may be mounted, to thereby adjust the axial spacing between the first and second lens components;
   means formed in the lens mounting section for creating radial adjustment flexure in the lens mounting section; and
   means for radially adjusting force imparted to the lens mounting section to cause the first lens component, when positioned within the lens mounting section, to move radially with respect to the second lens component when the second cell is coupled to the first cell, to thereby radially adjust the first lens component optical axis with respect to the second lens component optical axis.

BRIEF DESCRIPTION OF THE DRAWINGS

The invention will be described in conjunction with the accompanying drawings, in which.

DETAILED DESCRIPTION

Figure 1:
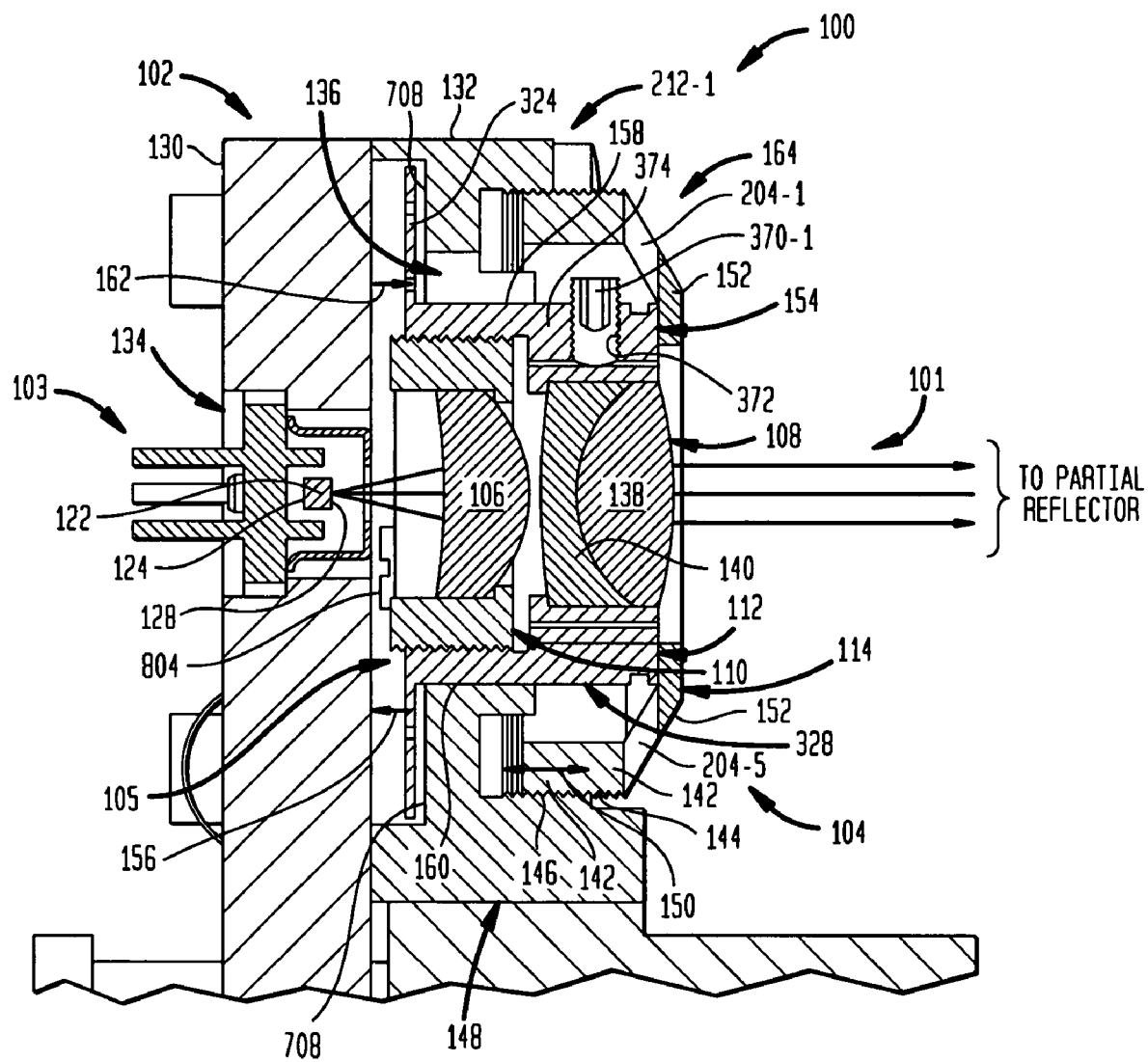
FIG. 1 is a side sectional view of a portion of an exemplary laser system comprising an embodiment of a collimation assembly comprising an embodiment of a collimation lens group according to the present invention.

It is advantageous to define several terms before describing the invention. It should be appreciated that the following definitions are used throughout this application.

Definitions

Where the definition of terms departs from the commonly used meaning of the term, applicant intends to utilize the definitions provided below, unless specifically indicated.

For the purposes of the present invention, directional terms such as "front", "back", "top", "bottom", "above", "below", "left", "right", "horizontal", "vertical", "upward", "downward", etc. are merely used for convenience in describing the various embodiments of the present invention. The embodiments of the present invention may be oriented in various ways. For example, the embodiments shown in FIGS. 1 through 7 may be flipped over, rotated by 90° in any direction, etc.

For the purposes of the present invention, the term "light source" refers to a source of electromagnetic radiation having a single wavelength or multiple wavelengths. The light source may be from a laser, a laser diode, one or more light emitting diodes (LEDs), etc.

For the purposes of the present invention, the term "coherent light beam" refers to a beam of light having waves with a particular (e.g., constant) phase relationship, such as, for example, a laser beam. A coherent light beam may also be referred to as light in which the phases of all electromagnetic waves at each point on a line normal to the direction of the light beam are identical.

For the purpose of the present invention, the term "collimated light beam" refers to a beam of light comprising rays which are mutually parallel, thus having a plane wavefront. Collimated light may sometimes be referred to as being focused at infinity. For example, a collimated light beam may be characterized by a wavefront sensor by have a seidel power term as close to 0 as possible.

For the purpose of the present invention, the term "collimation lens group" refers to a group of two or more lenses for use in collimating a coherent light beam to generate a collimated light beam.

For the purpose of the present invention, the term "wavefront error" refers to a metric by which the quality of a light beam is quantified. Wavefront error also refers to the deviation from an ideal electromagnetic wavefront converging to an infinitely small spot where each location on the wavefront surface is the same path length from the focused spot.

For the purpose of the present invention, the term "centration" refers to the process of aligning, centering, etc., the optical axis of one component radially with respect to the optical axis of another component. For example, centration may refer to aligning, centering, etc., the optical axis of one lens with respect to the optical axis of another lens such that a coherent light beam may pass through the respective optical axes of both lenses in one axial direction. This centration process may be used to improve the quality of the laser light beam in terms of reduced wavefront error (e.g., odd order aberrations), etc.

For the purposes of the present invention, the term "optical axis" refers to an imaginary line that defines the path along which light propagates through a system. For a lens, the optical axis passes through the center of curvature of each surface of the lens, and ideally coincides with the axis of rotational symmetry of the lens that is considered the mechanical axis. The optical axis may be, but is not necessarily coincident with, the mechanical axis. This discrepancy between the optical axis and mechanical axis may be the result of manufacturing tolerances.

For the purpose of the present invention, the term "axial direction" refers to a direction along a line, which may be an optical axis. For example, a light beam may traverse in an axial direction through a lens.

For the purpose of the present invention, the term "radial direction" refers to a direction from an optical (or central) axis towards the outer or outside diameter, periphery, perimeter, etc., of the element, component, etc. For example, the spokes of a wheel are in a radial direction from the hub. The radial direction is normal to the axial direction.

For the purpose of the present invention, the term "optical cavity" refers to a space between two reflective components, surfaces, etc. Exemplary optical cavities may comprise the space between reflective surfaces in a laser system, such as, for example, the space between a reflective coating on a facet of a laser diode and a Bragg reflector, diffraction grating, mirror, etc.

For the purpose of the present invention, the term "cell" refers to a component, element, part, etc., in which one or more lenses may be mounted, positioned, placed, glued, etc.

For the purpose of the present invention, the term "flexure" refers to a characteristic of a device, cell, component, element, part, etc., that creates, increases, adds, etc., flexibility, elasticity, ability to bend, etc., in or to the device, cell, component, element, part, etc., thus imparting "spring-like" characteristics. Flexures may include portions, segments, sections, etc., of a device, cell, component, element, part, etc., from which material may be cut, slashed, notched, grooved, etched, sliced, absent, removed, etc., to form, for example, membranes, cantilevers, beam- or shell-like structures, successive connections or links between more rigid bodies, etc., having more elastic properties for providing, imparting, creating, etc., a "spring-like" motions of one link relative to another to maintain precise relationship between linked bodies and providing sufficient compliance to accommodate relative motion in a specific direction, etc.

For the purposes of the present invention, the term "compliant mechanism" refers to a device, cell, component, element, etc., having flexures which respond to, comply with, etc., an applied force by bending, flexing, changing, etc., its shape, form, etc., in a controllable manner which is dependent upon the applied force.

For the purposes of the present invention, the term "axial adjustment flexure" refers to flexure in a component, element, cell, portion, segment, etc., which provides, imparts, creates, etc., motion in an axial direction.

For the purposes of the present invention, the term "radial adjustment flexure" refers to flexure in a component, element, cell, portion, segment, etc., which provides, imparts, creates, etc., motion in a radial direction.

For the purposes of the present invention, the term "flexure cell" and similar terms (e.g., "lens mounting flexure cell") refer to a cell having one or more flexure means.

For the purpose of the present invention, the term "lens" refers to a light transmittable optical element which may cause light to either converge (i.e., concentrate or focus) or to diverge (i.e., diffuse or scatter). Lenses may comprise different shapes, for example, may be biconvex (also called double convex, or just convex) if both surfaces are convex, may be biconcave (or just concave) if both surfaces are concave, may be plano-convex or plano-concave if one of the surfaces is flat or planar, may be convex-concave (or concave-convex) if one side is convex and one side is concave side, may be a meniscus lens (i.e., if the curvature of both sides is equal). Lenses may also comprise various light transmitting materials, such as glass, plastic, etc. Lenses may be formed by refractive or diffractive means (e.g., zone plates, diffractive optical elements (DOEs), etc.).

For the purpose of the present invention, the term "singlet lens" refers to a lens comprising one (i.e., a single) lens. As used herein, the terms singlet lens and singlet are used interchangeably.

For the purpose of the present invention, the term "doublet lens" refers to a lens comprising two different lenses. Exemplary doublet lenses may include a lens comprising a first lens and a second lens attached to one another using, for example, optical quality glue. In some embodiments, the two lenses comprising the doublet lens may be manufactured from two different materials, have different shapes, etc.

For the purposes of the present invention, the term "thread pitch" refers to the conventional meaning of the term, namely the distance between the same point on two adjacent threads of a threaded surface.

For the purposes of the present invention, the term "resolution" refers to the degree, fineness, etc., of the optical or mechanical properties achieved by a minimum adjustment increment of one or more assemblies, groups, cells, components, elements, etc., of the system.

Description

The present invention is directed at collimation lens groups, laser systems comprising such collimation lens groups and flexure cells used in such a collimation lens groups which may provide for: (1) adjustment of the axial spacing between first and second lens components of the collimation lens group; (2) radial adjustment of one lens component with respect to another lens component of the collimation lens group such that the optical axes of the respective lens components are optically aligned, centered, collimated, etc.; and (3) adjusting the collimation assembly comprising the collimation lens group axially with respect to the laser assembly to thereby focus the light beam transmitted through the subassembly. Embodiments of the flexure cell of the present invention used in the collimation lens group which may provide for: (a) radial adjustment of the optical axis of one lens component with respect the optical axis of another lens component with the ability to controllably align these optical axes; (b) axial adjustment of the position of the collimation lens group with respect to the laser assembly, thus providing effective focusing of the laser light beam; and (c) a compliant mechanism which permits precise and controllable adjustment of the laser light beam optical properties.

One embodiment of the present invention is directed at a collimation lens group comprising a first lens component positioned within a first lens mounting cell, a second lens component positioned within a second lens mounting cell and provided with a central portion for adjustably coupling with the first cell to thereby adjust the axial spacing between the first and second lens components, means for radially adjusting the position of the second lens component with respect to the first lens component to thereby radially adjust the optical axis of the second lens component with respect to the optical axis of the first lens component, means formed in the second lens mounting section of the central portion of the second cell for creating radial adjustment flexure therein to impart, provide, create, etc., compliant "spring-like" characteristics, and means formed in the flange portion of the second cell for creating axial adjustment flexure therein to impart, provide, create, etc., compliant "spring-like" characteristics.

Another embodiment of the present invention is directed at a laser system comprising a laser assembly for generating a laser light beam, and a collimation assembly axially adjustable with respect to the laser assembly and being positioned in the optical path of the light beam. The collimation assembly comprises a collimation lens group, and means for adjusting the axial spacing between the collimation assembly and the laser assembly to thereby focus the light beam.

Yet an another embodiment of the present invention is directed at a flexure cell for mounting a lens component comprising a generally annular shaped flange portion, means formed in the flange portion for creating axial adjustment flexure therein, and a generally cylindrical central portion extending generally perpendicularly from the flange portion. The central portion comprises lens component mounting section within which a first lens component may be positioned and radially moved, and a cell coupling section for mating with a second lens component mounting cell having a lens component mounting space within which a second lens component may be positioned, mounted, etc., to thereby adjust the axial spacing between the first and second lens components. The lens mounting section has formed therein means for creating radial adjustment flexure in the lens mounting section. The flexure cell is further provided with means for radially adjusting force imparted to the lens mounting section to cause the first cell lens component, when positioned within the lens mounting section, to move radially with respect to the second lens component when the second cell is coupled to the first cell, to thereby radially adjust the optical axis of the first lens component with respect to the optical axis of the second lens component.

Figure 2:
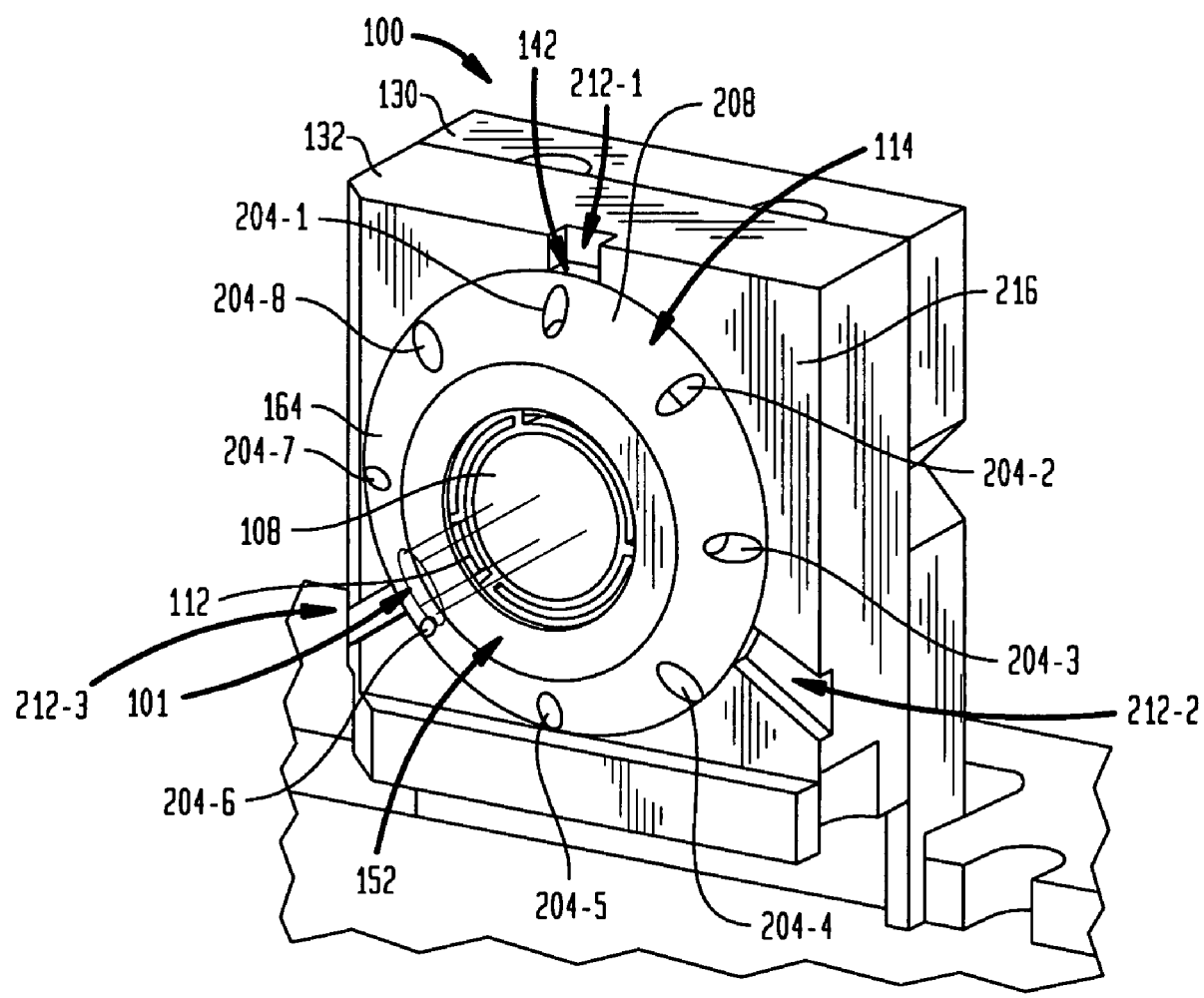
FIG. 2 is a frontal perspective view of the laser system of FIG. 1.

FIGS. 1 and 2 show a portion of an exemplary laser system (e.g., an external cavity diode laser system), indicated generally as 100, comprising an embodiment of an adjustable collimation assembly and collimation lens group according to the present invention. As shown in FIG. 1, laser system 100 generates or provides a collimated laser light beam, indicated generally as 101, having an optical path. Referring to FIGS. 1 and 2, laser system 100 comprises a housing in which components of laser system 100 may be housed, positioned, mounted, etc., and which is generally indicated as 102, a laser assembly, for example a laser diode, which is indicated generally as 103, and a collimation assembly, indicated generally as 104, which is positioned within housing 102 in the optical path of light beam 101. As also shown in FIG. 1, collimation assembly 104 is axially spaced from laser diode 103 and is axially movable with respect to laser diode 103. Collimation assembly 104 includes a collimation lens group, indicated generally as 105, and which comprises a first lens component in the form of, for example, singlet lens 106 and a second lens component in the form of, for example, doublet lens 108. Singlet lens 106 and doublet lens 108 together cooperate in collimation lens group 105 to collimate a coherent laser light beam generated by laser diode 103 to thereby provide a collimated light beam 101. Collimation assembly 104 may further comprise a generally cylindrical first lens component mounting member in the form of first lens mounting cell 110, a second lens component mounting member in the form of, for example, a second lens mounting flexure cell 112 having a generally T-shaped cross-section, and a generally annular focusing member in the form of focusing ring 114. First cell 110 and second cell 112 cooperate together and are used to adjust the relative axial and radial positions of singlet lens 106 and doublet lens 108, so as to collimate, align, center, etc., light beam 101, while focusing ring 114 is used adjust the axial spacing between collimation assembly 104 and laser diode 103 to focus light beam 101, as will be discussed in more detail below.

Referring to FIG. 1, laser diode 103 may be, for example, any type of device capable of producing a laser light beam, such as, for example, a semiconductor device capable of producing a laser light beam. As further shown in FIG. 1, laser diode 103 may include a diode crystal 122 (also sometimes referred to as a crystal wafer), a highly reflective coating (e.g., R>98%) on facet 124 of crystal 122, and an anti-reflective coating (e.g., R<0.5%) on the other opposite facet 128 of crystal 122. It should be noted that laser diodes, such as laser diode 103, are well known to those skilled in the art, and as such are not described further herein.

Referring again to FIG. 1, housing 102 may comprise a back or rearward laser diode mounting component, indicated generally as 130, and a forward collimation assembly mounting component 132. Rearward mounting component 130 comprises a chamber or space 134 for receiving and mounting laser diode 103. Collimation assembly mounting component 132 comprises a chamber or space 136 for receiving and mounting collimation assembly 104. Mounting components 130 and 132 may be formed as separate components and joined together as shown FIG. 1 to provide housing 102, as is described in more detail below. Second cell 112 of collimation assembly 104 is secured or attached to forward mounting component 132, as is described in more detail below.

Referring to FIG. 1, singlet lens 106 (which is referred to hereafter as singlet 106) may be a standard commercially available lens, such as, for example, a convex lens, concavo-convex lens, etc. For exemplary purposes, singlet 106 is illustrated in FIG. 1 as being in the form of a concave-convex lens, but in other embodiments, different types of lenses may be used for singlet 106 depending upon the optical design desired. Doublet lens 108 (which is referred to hereafter as doublet 108), is illustrated as comprising a forwardly positioned convex lens 138 and a rearwardly positioned convex-concave lens 140. Lenses 138 and 140 may be attached together using, for example, optical glue. Combining two lenses such as 138 and 140 to form a doublet is well known those skilled in the art and is not discussed further herein. As will be further discussed below, the combination of singlet 106 and doublet 108 may be used to collimate light beam 101.

Referring to FIGS. 1 and 2, a back or rearward section 142 of focusing ring 114 has a threaded outside diameter or exterior surface 144 which is received by space 136, and which engages and mates with a threaded generally cylindrically-shaped inner diameter or interior surface 146 formed in the forward end 148 of forward mounting component 132. The threaded interior surface 146 receives, mates with and engages threaded exterior surface 144 to provide an axially adjustable coupling means between focusing ring 114 and forward mounting component 132 such that rotation, turning, twisting, etc., of focusing ring 114 in, for example, a clockwise direction (as viewed from the front of focusing ring 114) will cause focusing ring 114 to move axially toward laser diode 103 and inwardly within forward end 148 of forward mounting component 132, while rotation, turning, twisting, etc., of focusing ring 114 in an opposite (counterclockwise) direction will cause focusing ring 114 to move axially away from laser diode 103 and outwardly within forward end 148, as indicated by double headed arrow 150. For the particular clockwise-counterclockwise direction of rotation, turning, twisting, etc., of focusing ring 114 described which causes focusing ring 114 to move axially toward or away from laser diode 103 should be considered exemplary, and is based on the threading of surfaces 146 and 144 as being right-handed. The direction of rotation, turning, twisting, etc., of focusing ring 114 which causes focusing ring 114 to move axially toward and away from laser diode 103 may also be reversed (counterclockwise-clockwise) when, for example, the threading of surfaces 146 and 144 is left-handed.

Double-headed arrow 150 also defines the focusing range of focusing ring 114. The focusing range 150 of focusing ring 114 may vary depending upon the particular laser system 100 involved, but may be, for example, in the range of up to about ±200 micrometers (i.e., up to about 200 micrometers in each axial direction from a starting unadjusted position or a total range of up to about 400 micrometers). For example, focusing ring 114 may be able to achieve up to about a 1 micrometer resolution in focusing laser system 100 by rotating focusing ring 114 about 1.44°. The ability to achieve these finer resolutions in focusing laser system 200 may be controlled by varying the thread pitch of threaded mating surfaces 144 and 146 used as a means for adjustable coupling focusing ring 114 to forward mounting component 132. To achieve finer resolution in focusing laser system 200, a thread pitch having a finer resolution of turn may be needed for threaded mating surfaces 144 and 146. The thread pitch may be chosen such that it provides the desired axial adjustment, with the thread choice being limited by the manufacturing ability and size of the parts, components, etc., involved. For example, a focusing ring 114 and forward mounting component 132 having a thread pitch of about 250 micrometers for threaded mating surfaces 144 and 146 may be used to cause axial movement of collimation lens group 105, relative to laser diode 103, of about 250 micrometers after one rotation of focusing ring 114. A thread pitch finer than about 250 micrometers (e.g., about 200 micrometers, about 150 micrometers, etc.) may be employed with threaded mating surfaces 144 and 146 if the position of collimation lens group 105 with respect to laser diode 103 needs to provide a very fine resolution.

Focusing ring 114 further includes a forward or front section, indicated as 152, which is adjacent to forward end 154 of second cell 112. Accordingly, when focusing ring 114 moves inwardly (i.e., within forward end 148 of forward mounting component 132) when rotated, turned, twisted, etc., clockwise, front section 152 engages forward end 154 of second cell 112, thus causing collimation lens group 105 to move axially towards laser diode 103, as indicated by arrow 156. As further shown in FIG. 1, the outer or exterior peripheral surface 158 of second cell 112 is received and guided during this inward axial movement of collimation lens group 105 by generally cylindrical central flexure cell guide bore 160 formed in forward mounting component 132.

Because second cell 112 is secured or attached to forward mounting component 132 (as further described below), there is increasing resistance to the movement of collimation lens group 105 towards laser diode 103 (i.e., in the direction indicated by arrow 156). This increasing resistance creates a certain amount of a stored up axial "spring-like" compliant force in second cell 112. When focusing ring 114 subsequently moves axially outwardly and away from laser diode 103 (i.e., when rotated, turned, twisted, etc., in the opposite counterclockwise direction), this stored up axial compliant force in second cell 112 is gradually released, thus causing exterior surface 158 to move axially in the opposite direction within central bore 160, with forward end 154 of second cell 112 moving axially away from laser diode 103. As a result, collimation lens group 105 also moves axially away from laser diode 103 (i.e., in the direction indicated by arrow 162).

As further shown in FIGS. 1 and 2, focusing ring 114 has intermediate tapered section 164 joining rearward section 142 and front section 152. As particularly shown in FIG. 2, means may be provided for enabling, assisting, etc., rotation of focusing ring 114, in either the clockwise or counterclockwise direction. For example, a plurality of gripping bores, indicated as 204, which are formed in intermediate section 164, and are positioned circumferentially and equidistantly along exterior surface 208 of intermediate section 164. These gripping bores 204, of which eight are shown and are indicated as 204-1 through 204-8, may be used to receive a focusing ring gripping tool (not shown) to enable easier rotation, turning, twisting, etc., of focusing ring 114. As also shown in FIG. 2, three access recesses or notches 212 are formed and spaced apart equidistantly (i.e., are spaced apart 120°) in face 216 of mounting component 132, and are indicated respectively as 212-1, 212-2 and 212-3. These access notches 212 are used to access certain means provided for second cell 112 (as described below) for radially adjusting and centering the position of doublet 108, relative to singlet 106, when focusing ring 114 is removed.

Figure 3:
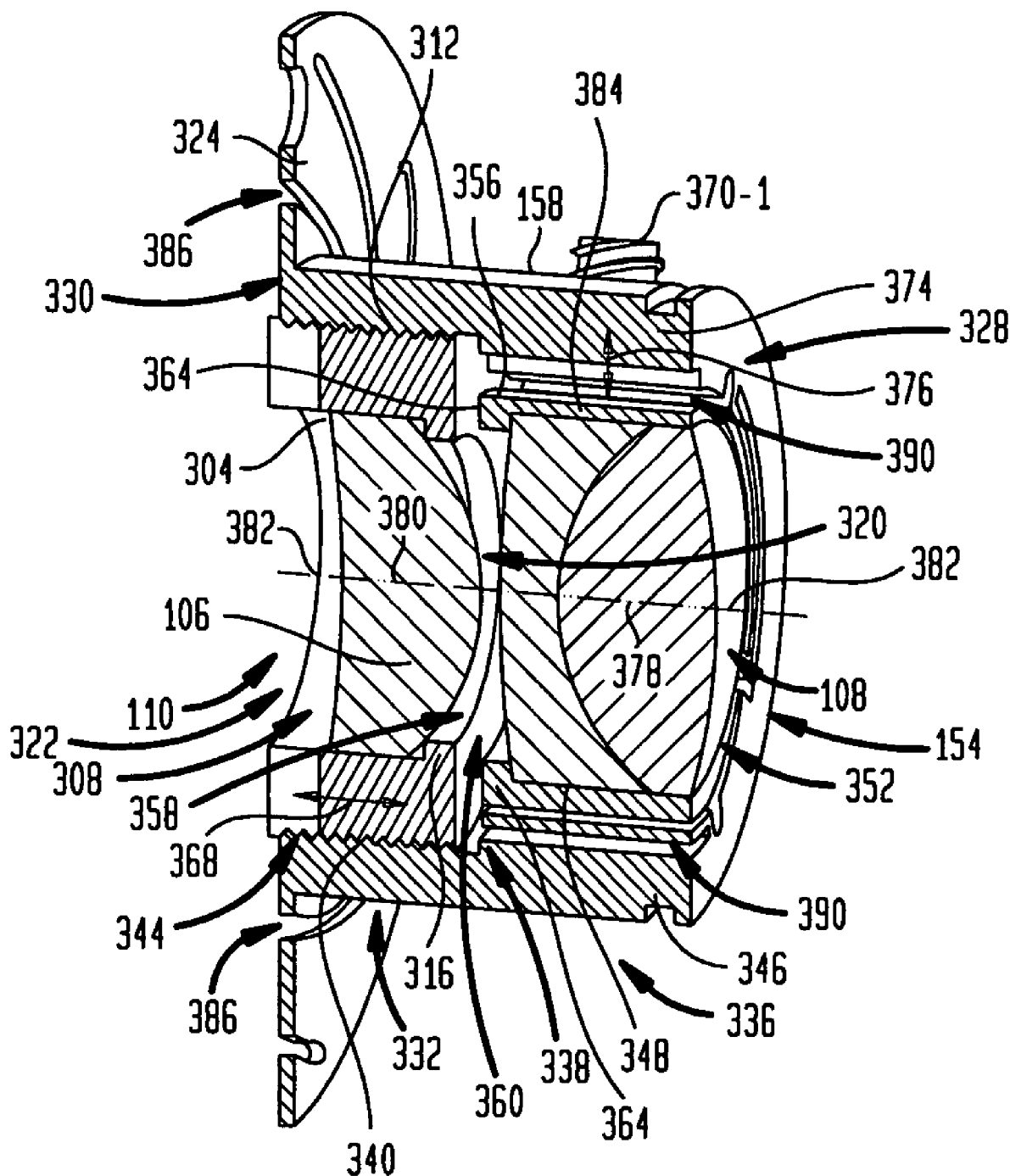
FIG. 3 is a side sectional view of the collimation lens group of FIG. 1.

Referring now to FIG. 3, first cell 110 has an inner diameter or surface 304 defining a generally cylindrical lens mounting chamber or space 308, a threaded outside diameter or exterior peripheral surface 312, and a generally annular shoulder 316 formed at the forward end 320 of lens mounting space 308. As further shown in FIG. 3, the opening at forward end 320 of lens mounting space 308 has a diameter smaller than the diameter of rearward end 322 of lens mounting space 308. As also shown in FIG. 3, singlet 106 may be positioned or mounted within lens mounting space 308 adjacent to and abutting annular shoulder 316, and may be secured in that position by any suitable means, for example, by gluing the singlet 106 to surface 304.

Referring also to FIG. 3, second cell 112 may have a generally annular flange portion 324, and a generally cylindrical central portion 328 extending perpendicularly from flange portion 324 from a back or rearward end 330 to forward end 154 of second cell 112. Central portion 328 comprises a rearward cell coupling section 332 and an adjacent forward lens mounting section 336. Cell coupling section 332 has a forward end 338, and an inner threaded surface 340 which receives, mates with and engages exterior threaded surface 312 of first cell 110 (and which further defines a cell receiving bore or chamber 344), to thereby provide an axially adjustable coupling means between first cell 110 and second cell 112. Lens mounting section 336 has an annular recess or groove 346 formed in exterior surface 158 proximate to or near front end 154, an inner surface 348 defining a generally cylindrical lens mounting chamber or space 352, and a generally annular shoulder 356 at the rearward end 360 of space 352. As further shown in FIG. 3, generally circular opening 358 at rearward end 360 of lens mounting section 336 has a diameter smaller than that of space 352. As also shown in FIG. 3, doublet lens 108 may be positioned or mounted within space 352 adjacent to and abutting annular shoulder 356 and may be secured in that position by any suitable means, for example, by gluing the doublet 106 to surface 348. Because forward end 338 of cell coupling section 332 has a diameter larger than that of opening 358 at rearward end 360 of lens mounting section 336, a generally annular shoulder 364 is formed at the juncture of sections 332 and 336.

The relative axial spacing between singlet 106 and doublet 108 may be controlled by the reversible axial movement of first cell 110, relative to second cell 112. This reversible axial movement of first cell 110 (and singlet 106), relative to second cell (and doublet 108), is shown by double-headed arrow 368, which is also referred to herein as defining the axial movement range of first cell 110, relative to second cell 112. Because of the cooperative, mating and threaded relationship between exterior surface 312 of first cell 110 and inner surface 340 of cell coupling section 332 of second cell 112, first cell 110 may be moved axially with respect to second cell 112 by rotating, turning, twisting, etc., first cell 110. Depending on how exterior surface 312 and inner surface 340 are threaded (i.e., right-handed or left-handed), first cell 110 may be rotated, turned, twisted, etc., in, for example, a clockwise direction (i.e., right-handed threading) so that singlet 106 is moved axially towards and closer to doublet 108, and in a counterclockwise direction so that singlet 106 is moved axially away and farther from to doublet 108. Again, it should be noted that the above described direction of rotation, turning, twisting, etc., of first cell 110 to cause axial movement of first cell 110 (and singlet 106) towards or away from second cell 112 (and doublet 108) is exemplary only. In other words, the direction of rotation may be reversed (i.e., where the threading of exterior surface 312 and inner surface 340 are left-handed) such that counterclockwise rotation causes axial movement of first cell 110 (and singlet 106) towards second cell 112 (and doublet 108), while clockwise rotation causes axial movement of first cell 110 (and singlet 106) away from second cell 112 (and doublet 108), without departing from the scope of the present invention. In addition, referring to this axial movement as being first cell 110 (and singlet 106), with respect to second cell 112 (and doublet 108), is merely a matter of choice, and could also be referred as being second cell 112 (and doublet 108), with respect to first cell 110 (and singlet 106).

The axial movement range 368 of first cell 110, relative to second cell 112, may vary depending upon the particular combination of first cell 110 (and singlet 106) and second cell 112 (and doublet 108) involved, but may be, for example, in the range of up about ±1 mm (i.e., up to about 1 mm in each axial direction from a starting unadjusted position or a total range of up to about 2 mm). Resolution of the axial movement of first cell 110, relative to second cell 112, may be controlled by varying the thread pitch of threaded mating surfaces 312 and 340. Generally, the finer the thread pitch of threaded mating surfaces 312 and 340, the finer the resolution in adjusting the axial movement of first cell 110, relative to second cell 112. The thread pitch for threaded mating surfaces 312 and 340 may be, for example, in range of about from about 0.2 to about 0.5 mm. For example, a thread pitch of about 0.3 mm for threaded mating surfaces 312 and 340 may provide adequate resolution of the axial movement of first cell 110, relative to second cell 112. As also shown in FIG. 3, axial movement range 368 of first cell 110 towards doublet 108 is limited by extent of threaded inner surface 340 which terminates before reaching shoulder 364.

As further shown in FIGS. 1 and 3, means may be provided for lens mounting section 336 of second cell 112 for radially adjusting and centering the position of doublet 108, relative to singlet 106, for example, in the form a plurality of set screws, indicated as 370. For the embodiment shown in FIGS. 1 and 3, three set screws (one of which is indicated as 370-1) may be provided, but more set screws than three may also be used without departing from the scope of the present invention. Each of set screws 370 may be received by respective cylindrical screw-receiving tapped holes or bores 372, one of which is indicated as 372-1 in FIG. 1, which may be formed in wall 374 of second cell 112 at lens mounting section 336. Set screw-receiving bores 372 may be positioned and spaced equidistantly and circumferentially (i.e., may be spaced 120° apart) around the exterior surface 158 of second cell 112 at lens mounting section 336.

Set screws 370 may be accessed, as well as inserted within bores 372, through notches 212 (i.e., notches 212-1, 212-2 and 212-3) when focusing ring 114 is removed. In particular, set screws 370 may be used as a means to radially adjust a portion of forward lens mounting section 336 of central portion 328, and thus doublet 108), as indicated by double-headed arrow 376, with respect singlet 106 so as to align optical axis 378 of doublet 108 with respect to optical axis 380 of singlet 106. This process of radially adjusting/aligning/centering doublet 108 (and optical axis 378) and singlet 106 (and optical axis 380) with respect to each other, is referred to herein as centration. When optical axes 378 and 380 are aligned with respect to each other to achieve centration, optical axes 378 and 380 are aligned along a longitudinal axis, which is indicated by dashed line 382, and which may also correspond to the optical axis of collimation lens group 105. The range of this radial or centration adjustment (which is referred to herein as the radial or centration range and which may be defined by double-headed arrow 376) may vary depending upon the particular collimation lens group 105 involved. This centration range 376 may often be a fairly small range, for example, in the range of up to about ±50 micrometers (i.e., up to about 50 micrometers in each radial direction from a starting unadjusted position or a total range of up to about 100 micrometers). The centration adjustment resolution may be controlled by adjusting the thread pitch of set screws 370 and respective bores 372. For example, the thread pitch for set screws 370 and bores may be, for example, in range of about from about 0.2 to about 0.4 mm (e.g., about 0.3) depending upon the optical sensitivity desired.

The particular centration adjustment of a portion of lens mounting section 336, and thus doublet 108, with respect to singlet 106 may be controlled by rotating, turning, twisting, etc., one or more set of screws 370 to cause these set screws 370 to move inwardly or outwardly in the radial direction indicated by double-headed arrow 376. By creating radial flexure adjustment in central portion 328 at lens mounting section 336 of the second cell 112 (as further described below), there is a compliant mechanism created for this inward and/or outward movement of set screws 370 during centration. For example, when one or more of set screws 370 are moved radially inwardly within respective bores 372, the end of screws 370 apply a radial force against inner portion 384 of wall 374 (at forward lens mounting section 336) at the bottom end of bore 372 to thus push inner wall portion 384 radially inwardly and against adjacent doublet 108. Conversely, when set screws 370 are moved radially outwardly within bores 372, the force applied against inner wall portion 384 is released such that inner wall portion 384 may move radially outwardly, e.g., in response to radial inward movement of other set screws 370. Accordingly, radial movement of one or more of set screws 370 inwardly and/or outwardly in the directions indicated by arrow 376 may be used to control the radial positioning (i.e., centration adjustment) of doublet 108, relative to singlet 106, by applying inward force against inner wall portion 384 and/or by releasing force applied to inner wall portion 384. The particular direction (i.e., clockwise or counterclockwise) of rotation, twisting, turning, etc., that causes the respective set screw 370 to move inwardly or outwardly is strictly a matter of choice, and is determined by the particular threading (i.e., right-handed or left-handed threading) on the set screws 370.

As further shown in FIG. 3, flexure means, indicated generally as 386, may be provided or formed in flange portion 324 for increasing the flexibility, elasticity, etc., to provide, impart, create, etc., an axial adjustment flexure in flange portion 324 of second cell 112, thus imparting a "spring-like" compliant mechanism to flange portion 324. In addition, flexure means, indicated generally as 390, may also be provided or formed in wall 374 of central portion 328 at lens mounting section 336 for increasing the flexibility, elasticity, etc., to provide, impart, create, etc., a radial adjustment flexure compliant mechanism in lens mounting section 336, thus imparting a "spring-like" compliant mechanism to lens mounting section 336. Flexure means 386 provide or impart to the flange portion 324 the ability to move axially (e.g., relative to laser diode 103) in a more precise manner with a controlled resolution, thus providing a compliant mechanism for axial focus adjustment of laser system 100. Flexure means 390 provide or impart to lens mounting section 336, along with doublet 108, the ability to move radially in a more precise manner with a controlled resolution, thus providing a compliant mechanism for centration adjustment with respect to alignment, centering, etc., of doublet 108 (and optical axis 378) and singlet 106 (and optical axis 380).

Figure 4:
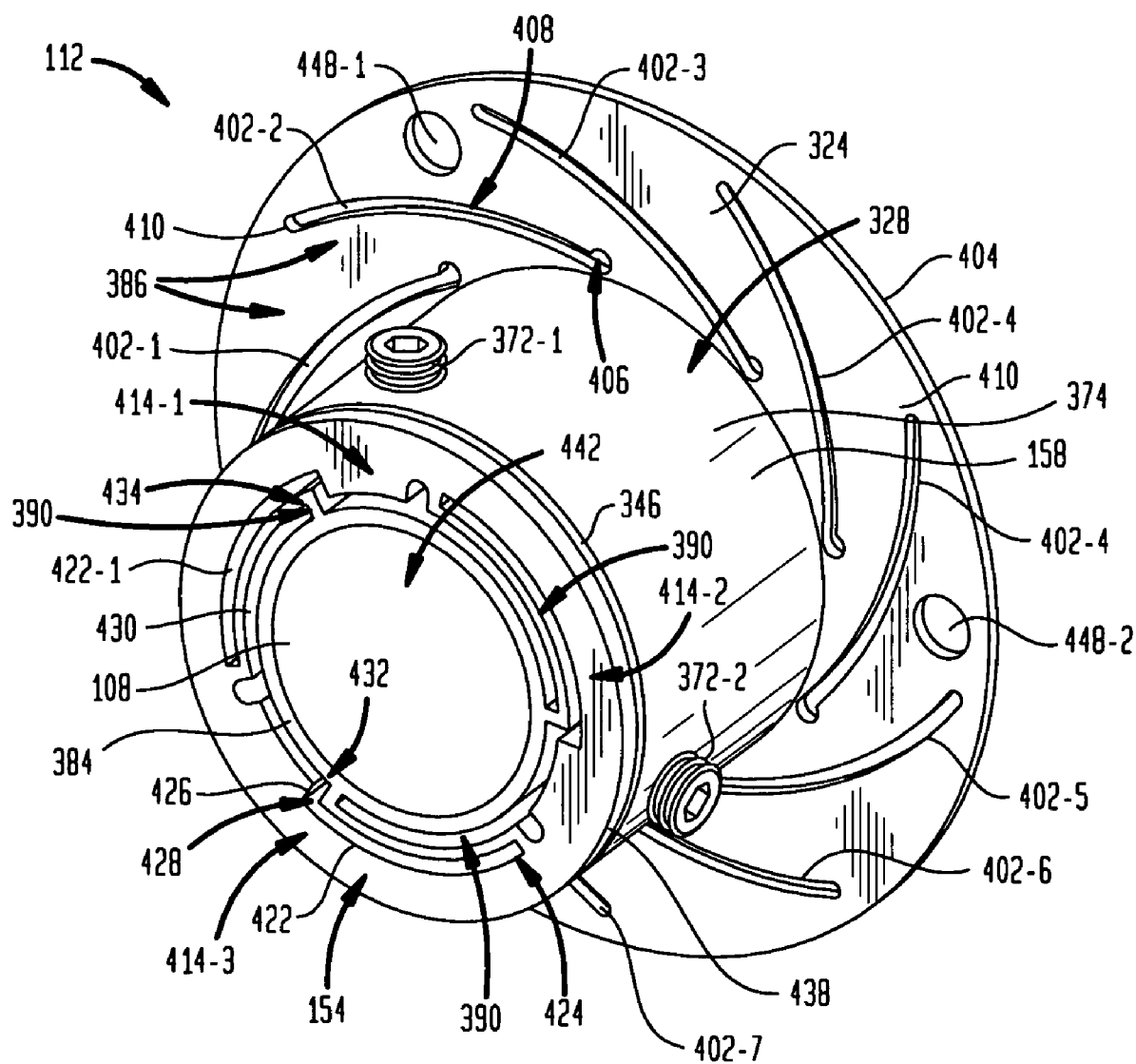
FIG. 4 is a frontal perspective view of the flexure lens component mounting cell shown in FIG. 3.
Figure 5:
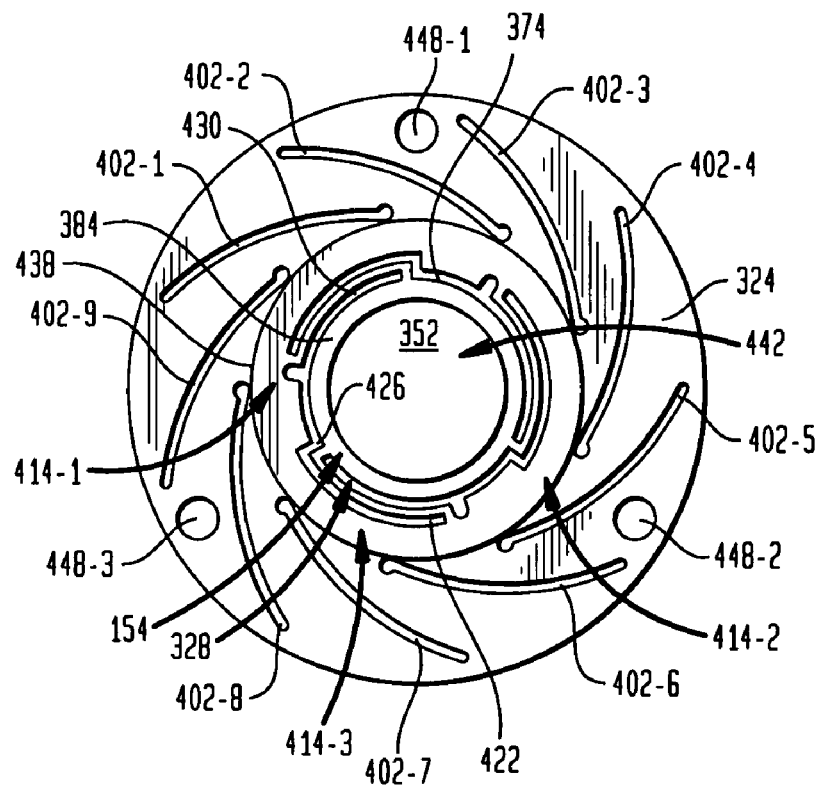
FIG. 5 is frontal view of the flexure cell shown in FIGS. 3 and 4.
Figure 6:
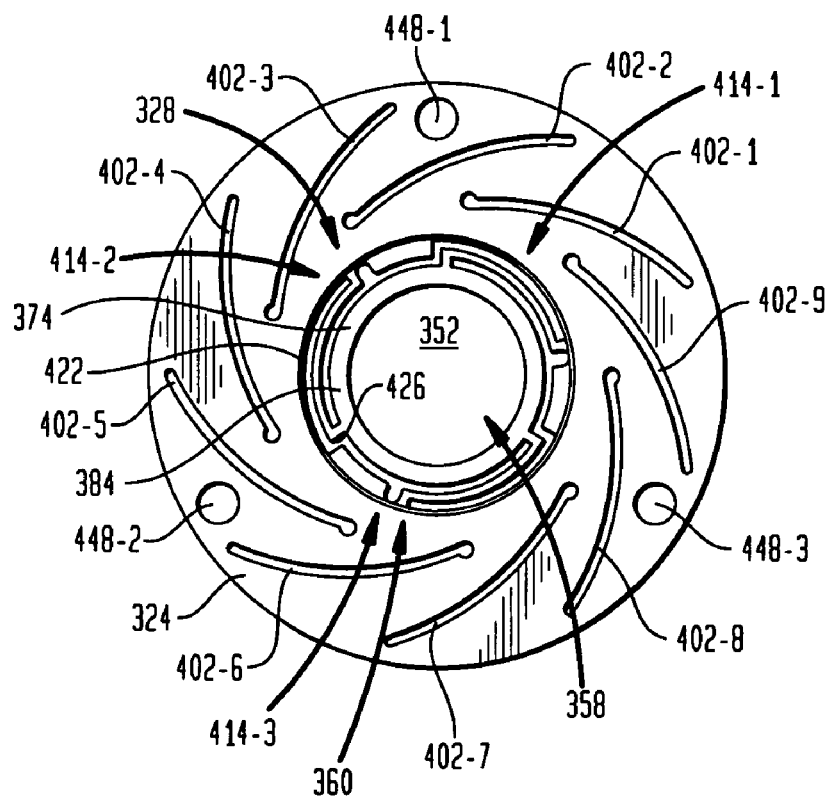
FIG. 6 is a back or rearward view of the flexure cell shown in FIG. 5.

Flexure means 386, as well as flexure means 390, are further shown and illustrated in FIGS. 4 through 6 which separately illustrate second cell 112, and which also show second cell 112 provided with three set screws 370, two of which are shown and indicated as 370-1 and 370-2. Second cell 112 may, for example, be formed as a single piece, for example, from a metal or metal alloy such as stainless steel with a suitable yield strength, titanium, etc., using any suitable technique (or combination of techniques), such as, for example, casting, machining, extrusion, milling lathe turning, electrical discharge machining (EDM), electrochemical milling (ECM), etc. Flexure means 386, as well as flexure means 390, may also be formed at the same time as the flange portion 324 and central portion 328 are formed for second cell 112, or may be formed after flange portion 324 and central portion 328 are formed for second cell 112.

Referring to FIGS. 4 through 6, flexure means 386 may be defined, created, etc., for example, by a plurality of elongated and generally arcuate slots 402 formed in flange portion 324, with slots 402 collectively forming, for example, a generally spiral-shaped pattern (also shown in FIGS. 4 through 6). Slots 402 may be formed in flange portion 324 during manufacture of second cell 112, and/or may be formed by removing material from flange portion 324 after manufacture of second cell 112. Nine such slots 402 are shown in FIGS. 4, and especially 5 and 6, and are indicated respectively, in clockwise order (i.e., with reference to FIG. 5), as 402-1, through 402-9, but fewer or more than nine such slots 402 may also be formed in flange portion 324 without departing from the scope of the present invention. Each of slots 402-1 through 402-9 may extend generally radially and outwardly from central portion 328 and may curve generally in the counterclockwise direction towards perimeter edge 404 of flange portion 324. For example, as illustrated by slot 402-2 in FIG. 4, each of these slots 402-1 through 402-9 may extend from one (beginning) end 406 proximate to or near central portion 328 along an elongated counterclockwise-curved main section 408 and terminate at the other end 410 proximate to or near edge 404. Alternatively, slots 402 may also curve generally in the opposite and clockwise direction from central portion 328 towards edge 404, may have shapes other than those shown in FIGS. 4 through 6, etc. For example, slots 402 may be wider or of a different shape in order to provide or impart more elasticity to flange portion 324, and may depend upon the required range of motion and yield strength of material used in the first cell 112. Slots 402 (or other flexure means 386) formed in flange portion 324 portion should allow flange portion 324 to retain elasticity and to not deform plastically (or permanently) during axial focus adjustment of collimation assembly 104, as described above.

As further illustrated in FIGS. 4 through 6, flexure means 390 may be defined, created, etc., for example, by a plurality of cavities, slits, gaps or voids 414 formed in wall 374 of central portion 328. These voids 414 may be continuous or discontinuous, and may be formed during manufacture of second cell 112, and/or may be formed by removing material from wall 374 after manufacture of second cell 112. Three such voids 414 are shown in FIGS. 4 through 6, and are indicated respectively, in clockwise order (i.e., with reference to FIG. 5), as 414-1, 414-2, and 414-3, but fewer or more than three such voids 414 may also be formed in wall 374 of central portion 328 as long as the desired radial adjustment flexure characteristics are obtained in lens mounting section 336 to provide the desired compliant mechanism during radial adjustment of the positioning and centration of doublet 108, relative to singlet 106, as described above. As shown in especially in FIGS. 5 and 6, each of voids 414 may extend through wall 374 from rearward end 360 of lens mounting section 336 to front end 154 of central portion 328, may have a generally S-shaped cross-section, may have a generally uniform width, etc. Alternatively, voids 414 may be of differing cross-sectional shapes from those illustrated in FIGS. 4 through 6, may have a non-uniform width, etc., as long as the desired radial adjustment flexure characteristics are obtained in lens mounting section 336.

As further illustrated in FIGS. 4 through 6 with reference to void 414-3, each of voids 414 may comprise a first longer outwardly curved exterior segment 422 extending from one (beginning) end 424, a second shorter transverse segment 426 extending transversely and inwardly from the other opposite end 428 of exterior segment 422, and a third longer outwardly curved interior segment 430 extending transversely from the other end 432 of transverse segment 426 and terminating at end 434 of interior segment 430 of void 414-3. As also shown in FIGS. 4 through 6, exterior segment 422 of each void 414 is nearer or closer to perimeter edge 438 of front end 154 of central portion 328, while interior segment 430 of each void 414 is closer or nearer to front opening 442 formed in front end 154, and rearward opening 444 formed at rearward end 330 of central portion 328. As a result and as further shown in FIGS. 4 through 6, the exterior segment 422 of one void 414 overlaps the interior segment 430 of another void 414 adjacent thereto (e.g., exterior segment 422-1 of void 414-1 which overlaps interior segment 430 of void 414-3). In addition, and as shown in FIGS. 4 through 6, interior segments 430 of voids 414-1 through 414-3 define inner portion 384 of wall 374. This particular overlapping relationship between segments 422 and 430 of adjacent voids 414 may also be reversed as long as the desired radial adjustment flexure characteristics are obtained in lens mounting section 336.

As further shown in FIGS. 4 through 6, each of voids 414 has an overall length extending from beginning end 424 to terminating end 434 of up to approximately one third the diameter of central portion 328 (e.g., as defined by the circumference of perimeter edge 438). The width of segments 422, 426 and 430, as well as the lengths of segments 422 and 430, are shown in FIGS. 4 through 6 as being generally uniform and symmetrical to facilitate the functionality of voids 414 in providing or imparting to lens mounting section 336 more precise and controlled radial adjustment flexure during centration of doublet 108 with respect to singlet 106. The widths of 422, 426 and 430 segments, as well as the lengths of segments 422 and 430, may also be non-uniform and differing as long as that functionality of voids 414 to provide or impart to lens mounting section 336 radial adjustment flexure during centration of doublet 108 with respect to singlet 106 is maintained.

The widths of 422, 426 and 430 segments, as well as the lengths of segments 422 and 430, define the thickness of flexures 390 defined, created, etc., by voids 414 formed in lens mounting section 336. Flexure thickness determines the range of radial motion permitted for lens mounting section 336 and also determines the degree of force required for radial adjustment by set screws 370. Thinner flexures 390 formed in lens mounting section 336 may require less applied force to inner wall portion 384 to effect radial adjustment with set screws 370, but may also be more prone to breakage or permanent plastic deformation during radial adjustment, thus losing or minimizing compliant mechanism properties of flexures 390. The particular geometrical parameters for flexures 390 may also depend on the required performance of lens mounting section 336 for radial adjustment of doublet 108 relative to singlet 106. Generated flexures 390 may also be designed to provide a specified range of radial motion by applying an estimated force. Stress analysis may also be performed to determine optimum flexure 390 performance, with stresses in key sections of flexures 390 not being higher than the yield stress of the material from which second cell 112 is made.

The relative location, width, etc., of segments 422, 426 and 430 may also generally depend on the thickness of wall 374 (e.g., as defined by the distance between perimeter edge 438 and front opening 442), while the relative length of segments 422 and 430 may generally depend on the diameter of central portion 328 (e.g., as defined by the diameter of perimeter edge 438). For example, exterior segment 422 is shown in FIGS. 4 through 6 as being spaced approximately two times its width away from perimeter edge 438 and approximately three times its width away from openings 442/444, and has a length up to approximately one sixth of the diameter of central portion 328 (e.g., as defined by the circumference of perimeter edge 438). Interior segment 430 is also shown in FIGS. 4 through 6 as being spaced approximately one times its width away from openings 442/444 and approximately five times its width away from perimeter edge 438, and has a length up to approximately one sixth of the diameter of central portion 328. Transverse segment is further shown in FIGS. 4 through 6 as having a length of up to approximately the combined width of segments 422 and 430.

Figure 7:
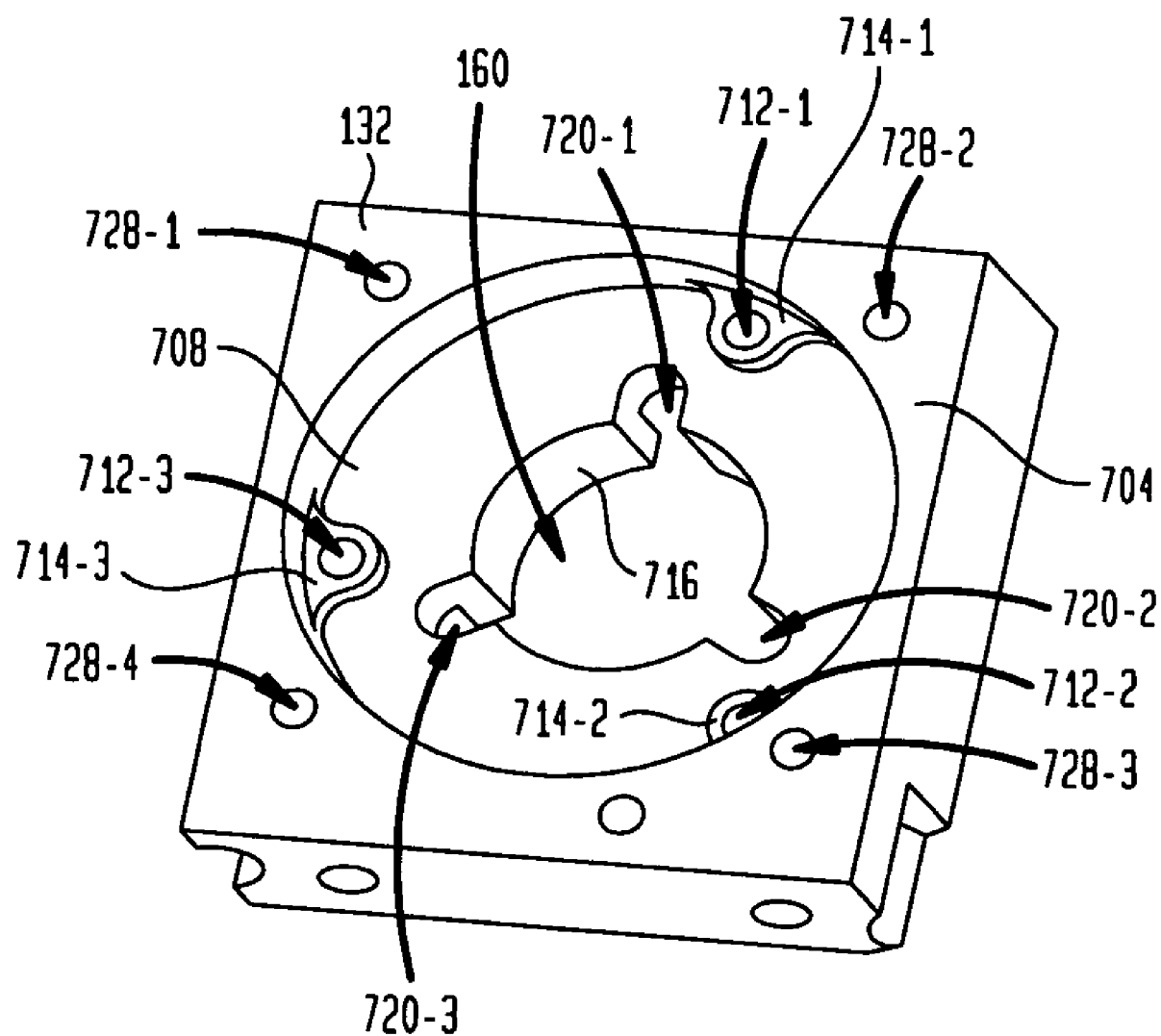
FIG. 7 is back or rearward perspective view of a portion of the laser system housing.
Figure 8:
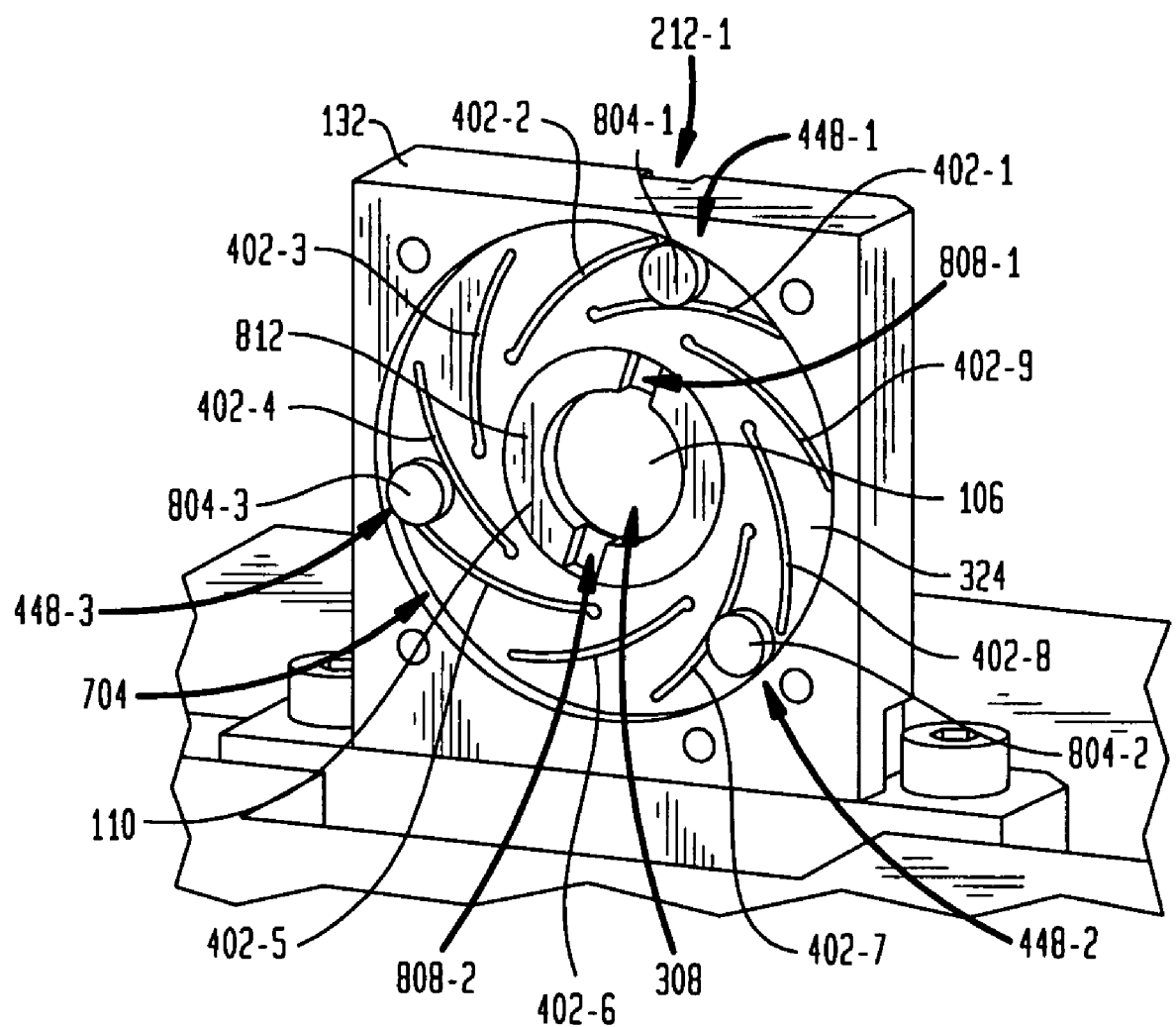
FIG. 8 is back or rearward perspective view illustrating mounting or attachment of the collimation lens group of FIGS. 3 through 6 to the portion of the laser system housing shown in FIG. 7.

As further shown in FIGS. 4 through 6, flange portion 324 is also provided with, for example, a plurality of holes 448 formed in flange portion 324. Three such holes 448, indicated as 448-1, 448-2, and 448-3, are shown in FIGS. 5 and 6, but more or fewer than three holes may also be formed in flange portion 324 without departing from the spirit or scope of the present invention. Holes 448-1, 448-2 and 448-3 are spaced apart equidistantly (i.e., are spaced apart 120°) and are used to secure or attach flange portion 324 to forward mounting component 132, as is further illustrated in FIGS. 7 and 8 which provide a back or rearward view of forward mounting component 132, with rearward mounting component 130 being removed from laser system 100. As shown in FIG. 7, forward mounting component 132 has a rearward end 704 in which is formed a generally annular and recessed surface 708. Three screw receiving holes 712-1 through 712-3 are formed in a circular arrangement in recessed surface 708 and are spaced apart equidistantly (i.e., are spaced apart 120°). Also shown in FIG. 7 are flange portion mounting pads 714 which extend outwardly from recessed surface 708 and surround each of holes 712, and are indicated as 714-1, 714-2 and 714-3. As further shown in FIG. 7, generally cylindrical surface 716 defines central bore 160, and is provided with three generally shaped recesses 720-1 through 720-3 which are spaced apart equidistantly (i.e., are spaced apart 120°) along surface 716. These recesses 720-1 through 720-3 allow or enable axial movement of set screws 370-1 through 370-3 when inserted into respective bores 372 of lens mounting section 336 of second cell 112 during installation or assembly of collimation lens group 105/collimation assembly 104. As also shown in FIG. 7, rearward end 704 is further provided with a plurality of holes, of which four are shown and are indicated as 728-1 through 728-4 for securing rearward mounting 130 to forward mounting component 132 by fasteners received by holes 728-1 through 728-4. Referring now to FIG. 8, fasteners in the form of screws 804-1, 804-2 and 804-3 are inserted through respective holes 448-1, 448-2 and 448-3, and into respective screw receiving holes 712-1 through 712-3 to secure or attach flange portion 324 to forward mounting component 132, with those areas of flange portion 324 proximate holes 448-1 through 448-3 resting or being positioned on respective pads 714-1 through 714-3. As further shown in FIG. 8, a pair of recesses 808-1 and 808-2 may be formed in rearward end 712 of first cell 110 opposite each other. These recesses 808-1 and 808-2 may be used (for example, by using a tool which grips these 808-1 and 808-2 recesses) to reversibly rotate, turn, twist, etc., first cell 110, relative to second cell 112, to thus adjust the axial spacing between singlet 106 and doublet 108, as described above. As also described above, because flange portion 324 is secured or attached to forward mounting component 132, there is increasing resistance as collimation lens group 105 is moved axially closer towards laser diode 103 (i.e., in direction indicated by arrow 156), thus creating a stored up axial "spring-like" compliant force in second cell 112. When focusing ring 114 subsequently moves axially away from laser diode 103 this stored up axial compliant force in flange portion 324 is gradually released, thus causing collimation lens group 105 to move axially away from laser diode 103 (i.e., in the direction indicated by arrow 162).

In operation, laser system 100 may be adjusted, centered, collimated, aligned, focused, etc., as follows: The relative axial spacing between singlet 106 and doublet 108 of collimation lens group 105 may be adjusted by clockwise (or counterclockwise) rotation, turning, twisting, etc., of first cell 110 relative to second cell 112 until the desired axial spacing between singlet 106 and doublet 108 is achieved (as described above). Centration of collimation lens group 105 may be achieved by radial adjustment of the positioning of doublet 108, relative to singlet 106, by rotating, turning, twisting, etc., one or more of set screws 370, until the optical axis 378 of doublet 108 is appropriately centered and aligned with respect to optical axis 380 of singlet 106 (as described above). Once the axial spacing between singlet 106 and doublet 108, as well as the centration of doublet 108 with respect to singlet 106, is achieved, final focusing of laser system 100 by axial adjustment of the spacing of collimating lens group 105, relative to laser diode 103, may be achieved by appropriate rotation, turning, twisting, etc. of focusing ring 114 in either a clockwise or counterclockwise direction (as described above).

Collimation assembly 104 may be assembled, as well as adjusted, centered, collimated, aligned, focused, etc., by using, for example, the following procedure: Initially, doublet 108 may be positioned or mounted within lens mounting section 336 of second cell 112 and then secured to second cell 112 (e.g., by gluing), while singlet 106 may be positioned or mounted within first cell 110, and then secured to first cell 110 (e.g., by gluing). First cell 110 may then be coupled to second cell 112 by screwing threaded exterior surface 312 into threaded inner surface 340 of cell coupling section 332 of second cell 112 to provide collimation lens group 105. Collimation lens group 105 comprising first cell 110 (with singlet 106) and second cell 112 (with doublet 108) of collimation assembly 104 may then be tested by transmitting a test laser beam (generated by a test laser) through singlet 106 and doublet 108 with the exiting light beam 101 being received by a wavefront sensor. The test laser may be, for example, any type of laser, such as, for example a red laser, green laser, etc., and may, for example, be a laser diode the same as or similar to laser diode 103. The wavefront sensor may be any type of wavefront sensor known to those skilled in the art, such as those commercially available. If the detected wavefront of exiting light beam 101 is determined to have any aberrations, such as for example, being out of focus, having coma or spherical aberrations, or otherwise be non-optimum, the axial spacing of first cell 110 relative to second cell 112, of collimation lens group 105 may then be adjusted by rotating, turning, twisting, etc., first cell 110 (as described above) in either a clockwise or counterclockwise direction to thereby adjust the axial distance between singlet 106 and doublet 108 (with subsequent analysis of the wavefront of exiting light beam 101) until the exiting light beam 101 is optimized for the reduction of spherical aberrations, etc.

In addition to adjusting the axial distance between singlet 106 and doublet 108, the radial positioning of doublet 108, relative to singlet 106, of collimation lens group 105 may be tested and adjusted so that the light beam 101 from the test laser traverses through the respective centers (i.e., along optical axes 380 and 378) of singlet 106 and doublet 108. This centration of collimation lens group 105 may be achieved (as described above) by appropriate adjustment of one or more set screws 370 to thereby adjust the radial positioning of doublet 108 (and optical axis 378) relative to singlet 106 (and optical axis 380). Whether the desired degree of centration of subassembly has been achieved may again be determined by analyzing the wavefront from exiting light beam 101 detected by the wavefront sensor to reduce coma aberrations.

After the appropriate axial spacing between singlet 106 and doublet 108, as well as centration of doublet 108 relative to singlet 106, have been achieved, the coupled collimation lens group 105 comprising cells 110 and 112 of collimation assembly 104 (positioned or mounted within space 136 of forward mounting component 132) is ready for coupling with focusing ring 114. Focusing ring 114 is coupled by screwing threaded exterior surface 144 of rearward section 142 into threaded interior surface 146 of forward mounting component 132 to thereby complete collimation assembly 104. Laser diode 103 may also be positioned or mounted within space 134 of rearward mounting component 130. As a part of the assembly and alignment procedure, laser diode 103 may be radially positioned, aligned and collimated with respect to collimation lens group 105 in a precise manner by controlled sliding of rearward mounting component 130, together with laser diode 103, on the surface of rearward end 704 of forward mounting component 132 using a tool (not shown). During this radial positioning/alignment/collimating process, light beam 101 may be monitored for optimum wavefront and beam direction, but initial focusing of the collimation lens group 105 may not be optimum. Accordingly, final focusing of the collimation lens group 105 may be achieved by using focusing ring 114 and monitoring of light beam 101 with a wavefront sensor to determine the proper focus of the collimation group 105 relative to the laser diode 103.

Forwarding mounting component 132 (with mounted and completed collimation assembly 104) and rearward mounting section 130 (with mounted laser diode 103 and after initial axial adjustment relative collimation lens group 105) may then be coupled together to provide a fully and completely assembled and complete laser system 100. Once laser system 100 is fully and completely assembled, light beam 101 generated by laser diode 103 may be detected, for example, by a wavefront sensor to determine the proper focusing of laser system 100, the presence of optical aberrations, etc., that may need to be minimized or eliminated using the alignment, focusing, centration, etc., techniques, as described herein. For example, focusing of light beam 101 may be achieved by appropriate rotation, turning, twisting, etc., of focusing ring 114 in the clockwise (or counterclockwise) direction, as describe above.

Figure 9:
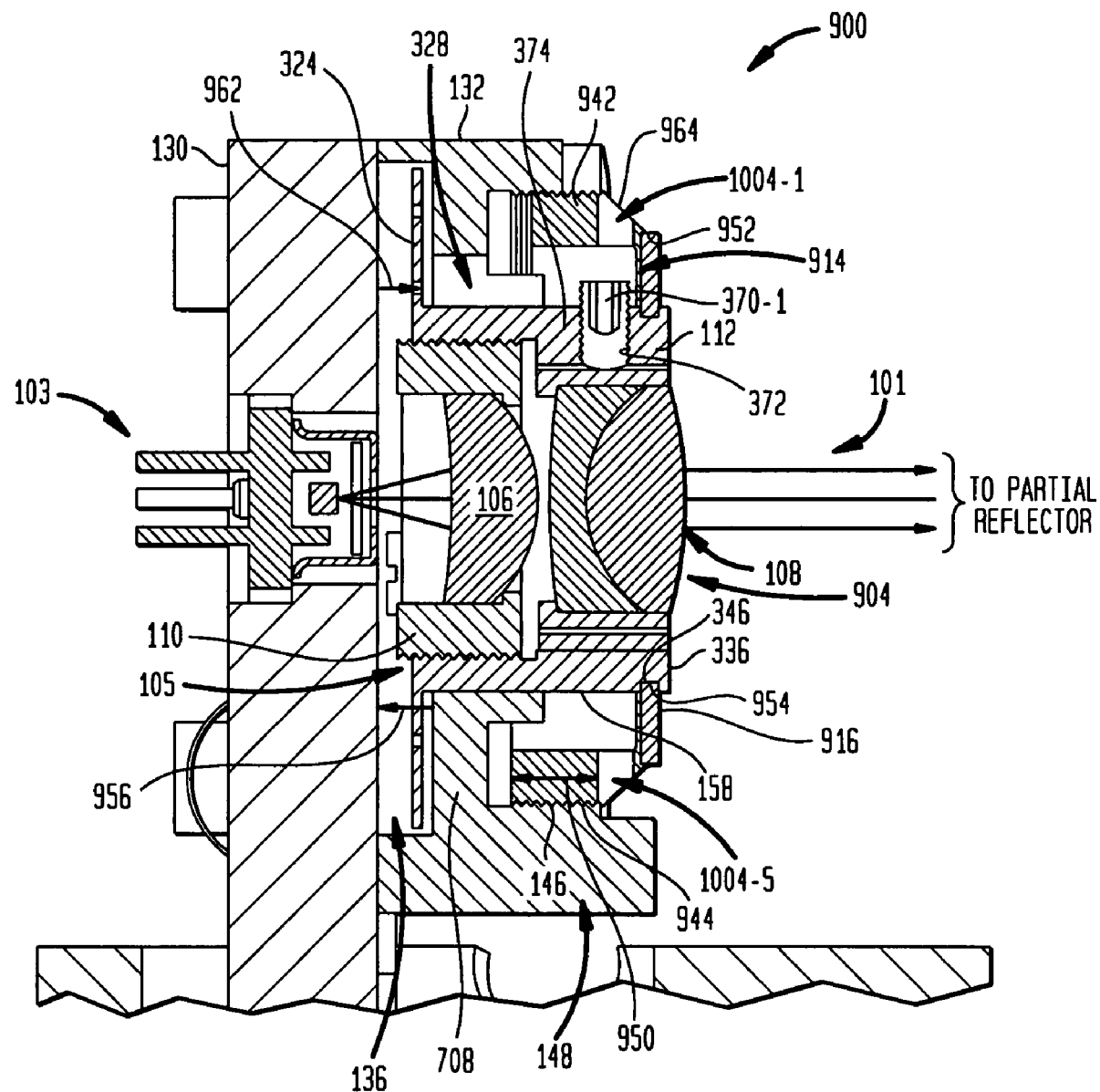
FIG. 9 is a side sectional view of an alternative embodiment of the laser system shown in FIG. 1, which allows for outward directional focusing of the laser light beam.

FIG. 9 illustrates an alternative embodiment of the laser system of the present invention, indicated as 900, which allows for outward focusing of laser diode 103. (Except as indicated below, laser system 900 is generally similar in make up and construction to laser system 100.) As shown in FIG. 9, laser system 900 comprises a collimation assembly 904 (corresponding and similar to collimation assembly 104 of FIG. 1) which includes a collimation lens group 105 (as in FIG. 1) having, a second cell 112 (as in FIG. 1) which is coupled to a first cell 110 (as in FIGS. 1 and 3) and light beam focusing member comprising an inner generally annular focusing ring 914 and an outer generally annular ring retention member 916 adjacent to focusing ring 914. As shown in FIG. 9, second cell 112 includes a central lens mounting and cell coupling section 332 (see FIGS. 3 through 6) and a forward lens mounting section 336 (see FIGS. 3 through 6). Focusing ring 914 includes back or rearward section 942 (similar to rearward section 142 of focusing ring 114) having a threaded exterior surface 944 (corresponding and similar to threaded exterior surface 144 of section 142) which is received by and cooperates with threaded interior surface 146 of forward end 148 (as shown in FIG. 1).

Focusing ring 914 includes a forward or front section 952 (corresponding and similar to front section 152 of focusing ring 114) which is contacted by adjacent and overlapping ring retention member 916. Ring retention member 916 has a generally annular inner rim 954 which engages and cooperates with corresponding generally annular recess or groove 346 (see FIGS. 1 and 3 through 6) formed in exterior surface 158 (see FIG. 1) of second cell 112. Accordingly, when focusing ring 914 moves inwardly (or outwardly) within forward end 148 of forward mounting component 132, as indicated by double headed arrow 950 (corresponding to double headed arrow 150 of FIG. 1), rim 954 of adjacent and attached ring retention member 916 engages groove 346 of second cell 112, thus causing second cell, as well as collimation lens group 105 to also move towards (or away from) laser diode 103, as indicated by arrows 956 and 962 (corresponding to arrows 156 and 162 of FIG. 1). In particular, engagement of rim 954 of ring retention member 916 within groove 346 of second cell 112 is what permits outward focusing of laser diode 103 when focusing ring 914 moves outwardly in the direction of arrow 962.

Because ring retention member 916 permits outward focusing of laser system 900 with focusing ring 914, collimation lens group 105 may be moved outwardly and away from laser diode 103 by use of focusing ring 914. As collimation lens group 105 is moved increasingly outwardly and away from laser diode 103 (i.e., in the direction indicated by arrow 962), there is increasing resistance to movement of collimation lens group 105 because flange portion 324 of second cell 112 is secured or attached to mounting component 132. This increasing resistance again creates a certain amount of a stored up axial "spring-like" compliant force in flange portion 324. Accordingly, when focusing ring 914 subsequently moves axially inward and towards laser diode 103, this stored up axial compliant force in flange portion 324 is gradually released, thus causing collimation lens group 105 to move axially towards laser diode 103 (i.e., in the direction indicated by arrow 956).

Figure 10:
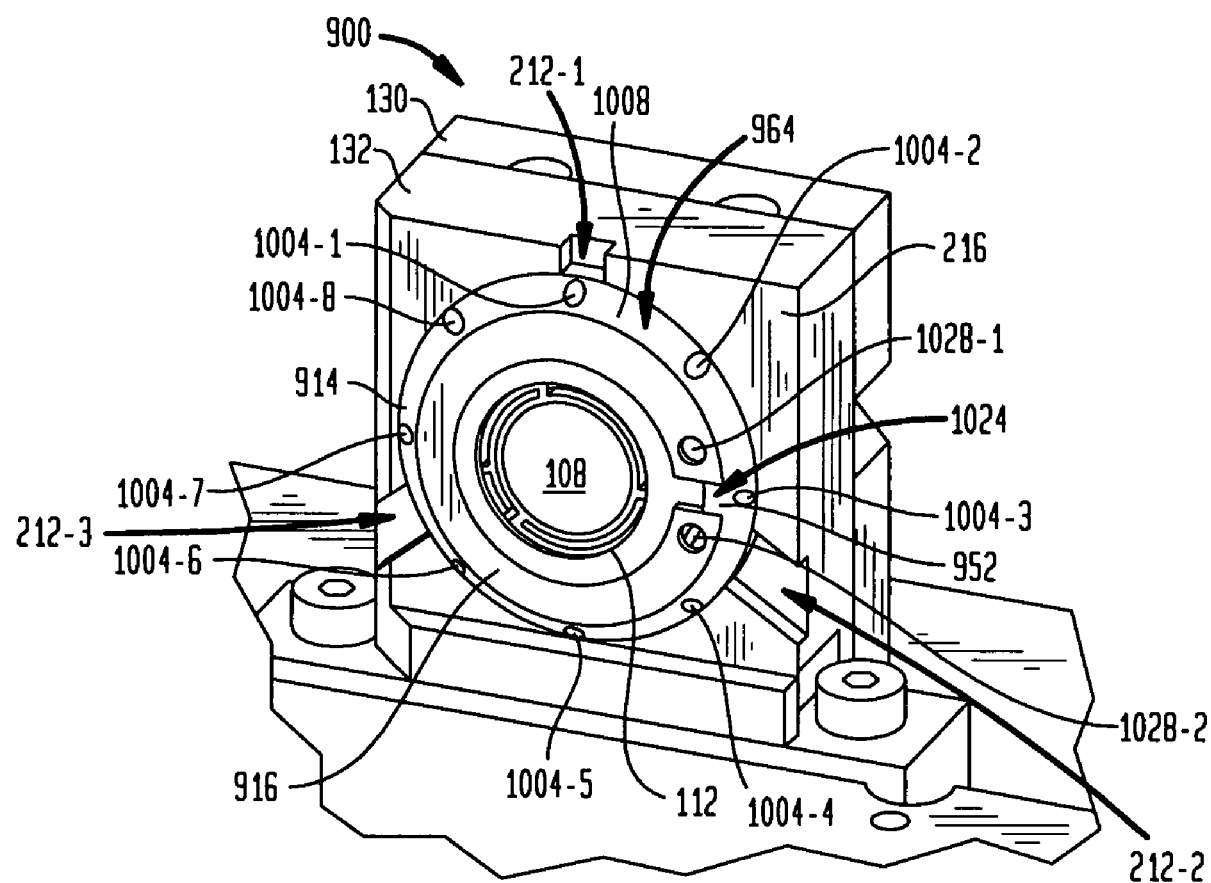
FIG. 10 is a frontal perspective view of the laser system of FIG. 9.

In addition, and as shown in FIG. 10, focusing ring 914 may be provided with means for enabling, assisting, etc., rotation of focusing ring 914, either clockwise or counterclockwise, for example, gripping bores 1004 (similar and corresponding to gripping bores 204 of FIG. 2) which are formed in intermediate section 964 and are positioned circumferentially and equidistantly along exterior surface 1008 of intermediate section 964. Eight such gripping bores 1004 (indicated in clockwise order as 1004-1, through 1004-8) are shown in FIG. 10, but fewer or more than eight such gripping bores 1004 may be formed in intermediate section 864. Like gripping bores 204, gripping bores 1004 may be used to receive a focusing ring gripping tool (not shown) to enable easier rotation, turning, twisting, etc., of focusing ring 914. Also shown in FIG. 10 is an a generally rectangular-shaped slot 1024 formed in ring retention member 916, and a pair of holes, indicated as 1028-1 and 1028-2, formed in ring retention member 916 on either side of slot 1024. Ring retention member 916 may be installed by inserting a tool (e.g., pliers) into 1028-1 and 1028-2 holes, with slot 1024 allowing ring retention member 916 to spread apart or opened so that rim 954 of ring retention member 916 may be fitted into and within groove 346 of second cell 112.

It should be appreciated that the specific embodiments illustrated in FIGS. 1 through 9 are provided to illustrate the teachings of the present invention. Alterations or modification within the skill of the art of the specific embodiments illustrated in FIGS. 1 through 9 are considered within the scope of the present invention, so long as these alterations or modifications operate in a same or similar manner, function, etc. These modifications may include the use of a single element, component, etc. (in place of a plurality of elements, components, etc.), the use of a plurality of elements, components, etc. (in place of a single of element, component, etc.), the changing of the order, orientation, direction, position, etc., of any of the elements, components, etc., the combining or integrating of any of the elements, components, etc., into a single or unified element, component, etc., or the ungrouping of an element, component, etc., into a plurality of associated elements, components, etc. For example, while the specific embodiments illustrated in FIGS. 1 through 9 show laser systems 100/900 being oriented generally horizontally, laser systems 100/900 may also be oriented generally vertically, or in any other orientation without departing from the scope of the present invention.

All documents, patents, journal articles and other materials cited in the present application are hereby incorporated by reference.

Although the present invention has been fully described in conjunction with several embodiments thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A device comprising a collimation lens group comprising:
    a first lens component having an optical axis;
    a second lens component having an optical axis and being axially spaced from the first lens component;
    a first lens component mounting cell having a lens mounting space within which the first lens component is positioned;
    a second lens component mounting cell having a flange portion and a central portion extending from the flange portion, the central portion comprising:
        a lens component mounting section within which the second lens component is positioned and radially movable; and
        a cell coupling section;
    means for adjustably coupling the first cell to the cell coupling section to adjust the axial spacing between the first and second lens components;
    means formed in the flange portion for creating flexure in the flange portion;
    means formed in the lens mounting section for creating radial adjustment flexure in the lens mounting section; and
    means for radially adjusting force imparted to the lens mounting section to cause the second lens component to move radially with respect to the first lens component to thereby radially adjust the second lens component optical axis with respect to the first lens component optical axis.

2. The device of claim 1, wherein the flange portion is generally annular and wherein the central portion is generally cylindrical and extends perpendicularly from the flange portion.

3. The device of claim 2, wherein the flange portion flexure means are created by a plurality of slots formed in the flange portion in a spiral-shaped pattern.

4. The device of claim 3, wherein the flange portion has a perimeter edge and wherein each of the slots comprises one end proximate to the central portion, an elongated counter-clockwise curved main section extending from the one and terminating in another end proximate to the perimeter edge.

5. The device of claim 2, wherein the lens component mounting section has a wall and wherein the central portion flexure means are created by a plurality of voids formed in the wall.

6. The device of claim 5, wherein the lens component mounting section has a rearward end and a front end, and wherein each of the voids extend through the wall from the rearward end to the front end.

7. The device of claim 6, wherein each of the voids has a generally S-shaped cross section.

8. The device of claim 5, wherein the radial adjusting means comprise a plurality of set screws, and a plurality of set screw-receiving bores formed in the wall at the lens mounting section, wherein each set screw-receiving bore receives one of the set screws.

9. The device of claim 8, wherein the voids define an inner portion of the wall at a bottom end of each screw receiving bore and adjacent to the second lens component, and wherein when one or more of the set screws move radially inwardly within the screw-receiving bore against the inner wall portion, an inward radial force is applied against the second lens component to thereby cause the second lens component to move radially with respect to the first lens component.

10. The device of claim 9 wherein the lens mounting section has an exterior peripheral surface, and wherein the set screw-receiving bores are positioned and spaced equidistantly and circumferentially around the exterior peripheral surface.

11. The device of claim 10, wherein there are three set screws and three set screw-receiving bores.

12. The device of claim 10, wherein the set screws provide a radial adjustment range of the second lens component with respect to the first lens component of up to about ±50 micrometers.

13. The device of claim 1, wherein the first lens component comprises a singlet lens.

14. The device of claim 13, wherein the singlet lens comprises a concave-convex lens.

15. The device of claim 14, wherein the second lens component comprises a doublet lens.

16. The device of claim 15, wherein the second cell is positioned forwardly relative to the first cell and wherein the doublet lens comprises a forwardly positioned convex lens and a rearwardly positioned convex-concave lens.

17. The device of claim 1, wherein the adjustable coupling means comprises a threaded exterior surface on the first cell and a threaded inner surface formed in the lens coupling section for receiving and adjustably mating with the first cell exterior surface.

18. The device of claim 17, wherein axial movement of the first cell with respect to the second cell is in the range of up about ±1 mm.

19. A system comprising a laser system comprising:
    a laser assembly for generating a light beam having an optical path; and
    a collimation assembly axially spaced from and axially movable with respect to the laser assembly and being positioned in the optical path, the collimation assembly comprising;
        a first lens component having an optical axis;
        a second lens component having an optical axis and being axially spaced from the first lens component;
        a first lens component mounting cell having a lens component mounting space within which the first lens component is positioned;

a second lens component mounting cell having a flange portion and a central portion extending from the flange portion, the central portion comprising;
   a lens component mounting section within with the second lens component is positioned and radially movable; and
   a cell coupling section;
means for adjustably coupling the first cell to the cell coupling section to adjust the axial spacing between the first and second lens components;
means formed in the flange portion for creating axial adjustment flexure in the flange portion;
means formed in the lens mounting section for creating radial adjustment flexure in the lens mounting section;
means for radially adjusting force imparted to the lens mounting section to cause the second lens component to move radially with respect to the first lens component to thereby radially adjust the second lens component optical axis with respect to the first lens component optical axis; and
means for adjusting the axial spacing between the collimation assembly and the laser assembly to thereby focus the light beam.

20. The system of claim 19, wherein the laser system further comprises a housing comprising a rearward laser assembly mounting component having a space for receiving and mounting the laser assembly and a forward collimation assembly mounting component having a space for receiving and mounting the collimation assembly.

21. The system of claim 20, wherein the flange portion is attached to the forward collimation assembly mounting component.

22. The system of claim 21, wherein the forward collimation assembly mounting component comprises a forward end having a generally cylindrically-shaped interior threaded surface, and wherein the axial spacing adjusting means comprises a rotatable generally annular focusing ring having a thread exterior surface which mates with and engages the interior threaded surface, and wherein the axial spacing between the collimation assembly and the laser assembly is adjusted by rotating the focusing ring in a clockwise or counterclockwise direction.

23. The system of claim 22, wherein the laser system provides a focusing range of up to about ±200 micrometers.

24. The system of claim 22, wherein the axial spacing adjusting means further comprises an outer generally annular ring retention member adjacent to and contacting the focusing ring and having a generally annular inner rim, wherein the second cell includes an exterior surface having a generally annular recess which receives and engages the inner rim, and wherein when the focusing ring moves inwardly or outwardly from the forward end of the forward mounting component when the focusing ring is rotated in a clockwise or counter-clockwise direction, the second cell moves inwardly or outwardly, to thereby cause the collimation assembly to move towards or away from the laser assembly.

25. The system of claim 20, wherein the flange portion is generally annular and wherein the central portion is generally cylindrical and extends perpendicularly from the flange portion.

26. The system of claim 25, wherein the flange portion flexure means are created by a plurality of slots formed in the flange portion in a spiral shaped pattern.

27. The system of claim 26, wherein the flange portion has a perimeter edge and wherein each of the slots comprises one end proximate to the central portion, an elongated counter-clockwise curved main section extending from the one and terminating in another end proximate to the perimeter edge.

28. The system of claim 20, wherein the lens component mounting section has a wall and wherein the central portion flexure means are created by a plurality of voids formed in the wall.

29. The system of claim 28, wherein lens component mounting section has a rearward end and a front end, and wherein each of the voids extend through the wall from the rearward end to the front end.

30. The system of claim 28, wherein each of the voids has a generally S-shaped cross section.

31. The system of claim 28, wherein the radial adjusting means comprise a plurality of set screws, and a plurality of set screw-receiving bores formed in the wall at the lens mounting section, wherein each set screw-receiving bore receives one of the set screws.

32. The system of claim 31, wherein the voids define an inner portion of the wall at a bottom end of each screw receiving bore and adjacent to the second lens component, and wherein when one or more of the set screws move radially inwardly within the screw-receiving bore against the inner wall portion, an inward radial force is applied against the second lens component to thereby cause the second lens component to move radially with respect to the first lens component.

33. The system of claim 32, wherein the lens mounting section has an exterior peripheral surface, and wherein the set screw-receiving bores are positioned and spaced equidistantly and circumferentially around the exterior peripheral surface.

34. The system of claim 33, wherein there are three set screws and three set screw-receiving bores.

35. The system of claim 33, wherein the laser system provides a radial adjustment range of the second lens component with respect to the first lens component of up to about ±50 micrometers.

36. The system of claim 20, wherein the first lens component comprises a singlet lens.

37. The system of claim 36, wherein the singlet lens comprises a concave-convex lens.

38. The system of claim 37, wherein the second lens component comprises a doublet lens.

39. The system of claim 38, wherein the second cell is positioned forwardly relative to the first cell and wherein the doublet lens comprises a forwardly positioned convex lens and a rearwardly positioned convex-concave lens.

40. The system of claim 19, wherein the laser assembly comprises a laser diode.

41. The system of claim 40, wherein the laser system comprises an external cavity laser diode system.

42. The system of claim 19, wherein the adjustable coupling means comprises a threaded exterior surface on the first cell and a threaded inner surface formed in the lens coupling section for receiving and adjustably mating with the first cell exterior surface.

43. The system of claim 42, wherein axial movement of the first cell with respect to the second cell is in the range of up about ±1 mm.

44. An article comprising a flexure cell comprising:
   a generally annular shaped flange portion;
   means formed in the flange portion for creating axial adjustment flexure in the flange portion;
   a generally cylindrical central portion extending generally perpendicularly from the flange portion, the central portion comprising;

a lens component mounting section within which a first lens component having an optical axis may be positioned and radially moved; and a cell coupling section having a threaded surface for mating with a threaded surface of a second lens component mounting cell having a lens component mounting space within which a second lens component having an optical axis may be mounted; to thereby adjust the axial spacing between the first and second lens components;

means formed in the lens mounting section for creating radial adjustment flexure in the lens mounting section; and means for radially adjusting force imparted to the lens mounting section to cause the first lens component, when positioned within the lens mounting section, to move radially with respect to the second lens component when the second cell is coupled to the first cell, to thereby radially adjust the first lens component optical axis with respect to the second lens component optical axis.

45. The article of claim 44, wherein the flange portion flexure means are created by a plurality of slots formed in the flange portion in a spiral shaped pattern.

46. The article of claim 45, wherein the flange portion has a perimeter edge and wherein each of the slots comprises one end proximate to the central portion, an elongated counter-clockwise curved main section extending from the one and terminating in another end proximate to the perimeter edge.

47. The article of claim 46, wherein nine slots are formed in the flange portion.

48. The article of claim 45, wherein the lens component mounting section has a wall and wherein the central portion flexure means are created by a plurality of voids formed in the wall.

49. The article of claim 48, wherein lens component mounting section has rearward end and a front end, and wherein each of the voids extend through the wall from the rearward end to the front end.

50. The article of claim 49, wherein each of the voids has a generally S-shaped cross section.

51. The article of claim 50, wherein the S-shaped cross section comprises a first longer outwardly curved segment, a second shorter transverse segment extending transversely from the first segment and a third longer outwardly curved segment extending from the transverse segment.

52. The article of claim 51, wherein the first segment comprises an exterior segment, wherein the transverse segment extends inwardly from the exterior segment, and wherein the third segment is an interior segment, and wherein the exterior segment of one void overlaps the interior segment of an adjacent void.

53. The article of claim 52, wherein there are three voids.

54. The article of claim 48, wherein the radial adjusting means comprise a plurality of set screws, and a plurality of set screw-receiving bores formed in the wall at the lens mounting section, wherein each set screw-receiving bore receives one of the set screws.

55. The article of claim 54, wherein the voids define an inner portion of the wall at a bottom end of each screw receiving bore and adjacent to the first lens component, and wherein when one or more of the set screws move radially inwardly within the screw-receiving bore against the inner wall portion, an inward radial force is applied against first lens component to thereby cause the first lens component to move radially with respect to the second lens component.

56. The article of claim 55, wherein the lens mounting section has an exterior peripheral surface, and wherein the set screw-receiving bores are positioned and spaced equidistantly and circumferentially around the exterior peripheral surface.

57. The article of claim 55, wherein there are three set screws and three set screw-receiving bores.

58. The article of claim 45, wherein the article provides a radial adjustment range of the first lens component with respect to the second lens component of up to about ±50 micrometers.

59. The article of claim 44, wherein the cell coupling section has a threaded inner surface, and wherein the second lens component mounting cell has a threaded exterior surface.

* * * * *